United States Patent
Nishikimi et al.

(10) Patent No.: US 9,596,782 B2
(45) Date of Patent: Mar. 14, 2017

(54) POWER CONVERTER WITH COOLING BOARD

(71) Applicant: Hitachi Automotive Systems, Ltd., Hitachinaka-shi, Ibaraki (JP)

(72) Inventors: Fusanori Nishikimi, Hitachinaka (JP); Kenji Ohshima, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 267 days.

(21) Appl. No.: 14/376,461

(22) PCT Filed: Jan. 21, 2013

(86) PCT No.: PCT/JP2013/051022
§ 371 (c)(1),
(2) Date: Aug. 4, 2014

(87) PCT Pub. No.: WO2013/121829
PCT Pub. Date: Aug. 22, 2013

(65) Prior Publication Data
US 2015/0049533 A1    Feb. 19, 2015

(30) Foreign Application Priority Data
Feb. 15, 2012   (JP) ................. 2012-030734

(51) Int. Cl.
*H05K 7/20* (2006.01)
*H02M 7/00* (2006.01)
(Continued)

(52) U.S. Cl.
CPC .......... *H05K 7/20127* (2013.01); *B60L 3/003* (2013.01); *B60L 3/0061* (2013.01);
(Continued)

(58) Field of Classification Search
CPC .. H05K 7/20127; H02M 7/797; H02M 7/003; B60L 3/0061; B60L 15/20;
(Continued)

(56) References Cited

U.S. PATENT DOCUMENTS 7,177,153 B2 * 2/2007 Radosevich ............ B60L 11/12
165/80.4
7,957,169 B2 * 6/2011 Nakajima ................ B60K 6/26
361/677

(Continued)

FOREIGN PATENT DOCUMENTS

JP  10-335761 A  12/1998
JP  2007-259596 A  10/2007
(Continued)

OTHER PUBLICATIONS

International Search Report dated Apr. 23, 2013 with English translation thereof {Four (4) pages}.

*Primary Examiner* — Adam B Dravininkas
(74) *Attorney, Agent, or Firm* — Crowell & Moring LLP

(57) ABSTRACT

In a power converter, cooling of the power converter is extremely important for improving a power conversion performance. Specifically, a DC smoothing capacitor module stored in a housing of the power converter is heat-sensitive, and in order to secure the performance, efficient cooling of the capacitor module is required. In addition, reducing the heat entering from the outside as much as possible is required.

A conductor panel of the capacitor module and the housing are connected via a cooling panel, an AC connection bus bar and the housing is connected by the cooling panel to release heat from the capacitor module and the AC connection bus bar to the housing via the cooling panel.

18 Claims, 12 Drawing Sheets

(51) Int. Cl.
*B60L 3/00* (2006.01)
*B60L 11/00* (2006.01)
*B60L 11/14* (2006.01)
*B60L 15/00* (2006.01)
*B60L 15/20* (2006.01)
*H02M 7/797* (2006.01)

(52) U.S. Cl.
CPC ............. *B60L 11/005* (2013.01); *B60L 11/14* (2013.01); *B60L 15/007* (2013.01); *B60L 15/20* (2013.01); *H02M 7/003* (2013.01); *H02M 7/797* (2013.01); *B60L 2210/40* (2013.01); *B60L 2220/14* (2013.01); *B60L 2240/36* (2013.01); *B60L 2240/423* (2013.01); *B60L 2240/525* (2013.01); *Y02T 10/645* (2013.01); *Y02T 10/70* (2013.01); *Y02T 10/7022* (2013.01); *Y02T 10/7077* (2013.01); *Y02T 10/7241* (2013.01); *Y02T 10/7275* (2013.01)

(58) Field of Classification Search
CPC ........ B60L 11/14; B60L 15/007; B60L 3/003; B60L 11/005; B60L 2220/14; B60L 2210/40; B60L 2240/36; B60L 2240/423; B60L 2240/525; Y02T 10/645; Y02T 10/7275; Y02T 10/70; Y02T 10/7022; Y02T 10/7241; Y02T 10/7077

USPC ................................ 361/689–693, 699, 700
See application file for complete search history.

(56) References Cited

U.S. PATENT DOCUMENTS

| | | | |
|---|---|---|---|
| 7,978,471 B2* | 7/2011 | Tokuyama | H01L 23/36 165/104.33 |
| 9,350,228 B2* | 5/2016 | Uetake | H02M 7/003 |
| 2008/0130223 A1* | 6/2008 | Nakamura | H02M 7/003 361/689 |
| 2008/0186751 A1* | 8/2008 | Tokuyama | H01L 23/473 363/131 |
| 2008/0251909 A1* | 10/2008 | Tokuyama | H01L 23/473 257/706 |
| 2010/0025126 A1* | 2/2010 | Nakatsu | B60L 11/00 180/65.1 |
| 2011/0249421 A1* | 10/2011 | Matsuo | B60L 7/14 361/821 |
| 2013/0021749 A1* | 1/2013 | Nakajima | H02M 7/003 361/689 |

FOREIGN PATENT DOCUMENTS

| | | |
|---|---|---|
| JP | 2010-81688 A | 4/2010 |
| JP | 2011-67093 A | 3/2011 |
| JP | 2011-217548 A | 10/2011 |

* cited by examiner (a)

(b)

POWER CONVERTER WITH COOLING BOARD

TECHNICAL FIELD

The invention relates to a power converter used for converting DC power to AC power, or converting AC power to DC power and, specifically, to the power converter capable of discharging heat generated in the interior of a housing that houses electric components of the power converter efficiently.

BACKGROUND ART

In general, a power converter includes a smoothing capacitor module that receives DC power from a DC power source, an inverter circuit configured to generate AC power upon reception of the DC power from the capacitor module, and a control circuit configured to control the inverter circuit.

The AC power obtained by the power converter is supplied to an electric motor (for example, a three-phase synchronous electric motor) and, depending on the supplied AC power, the electric motor generates a rotational torque. The electric motor generally has a function as a power generator, and generates AC power by a rotational force supplied to the electric motor from the outside.

In this manner, the power converter also has a function to convert AC power to DC power in many cases, and AC power generated by the electric motor is converted into DC power. Conversion from DC power to AC power, or conversion from AC power to DC power is controlled by the control apparatus.

For example, when the electric motor is a synchronous electric motor, control relating to the conversion of the power can be performed by controlling a phase of a rotating field that a stator generates with respect to the position of a magnetic pole of a rotor of the synchronous electric motor. An example of the power converter is disclosed in JP-A-2011-217548 (PTL 1).

The power converter is mounted on, for example, a hybrid system automotive vehicle, and generates AC power for supplying to the electric motor which generates a traveling rotational torque upon reception of DC power from a secondary battery mounted on the automotive vehicle. At the time of a regenerative braking operation such as a decelerating operation of the automotive vehicle, the electric motor generates AC power by being rotated by a rotation of wheels for generating a braking force, the generated AC power is converted into the DC power by the power converter, is stored in the secondary battery, and is used as a power for traveling again.

CITED REFERENCE

Patent Literature

PTL 1: JP-A-2011-217548

SUMMARY OF INVENTION

Technical Problem

In the interior of the housing of the power converter as described above, many electronic components, for example, an insulting gate type bipolar transistor generating a high calorific power or the like is used in many cases. Therefore, there is a phenomena that the interior of the housing assumes a high-temperature environment due to the heat generation of the electronic components. In addition, a conductive wire having good heat conductivity, which is electrically connected to the electric motor, is connected to the power converter. Therefore, there is a phenomena that heat of the electric motor enters a bus bar of the power converter via the conductive wire and, this heat enters the inverter circuit unit, and depending on the case, enters a capacitor module as well, whereby the temperature in the interior of the housing of the power converter is increased as a result.

In the power converter, cooling of the power converter is extremely important for improving a power conversion performance. Specifically, a DC smoothing capacitor module stored in the housing of the power converter is heat-sensitive, and in order to secure the performance, efficient cooling of the capacitor module is required. In addition, reducing the heat entering from the outside as much as possible is required.

It is an object of the present invention to provide the power converter that fulfills one or both of needs to cool a capacitor module efficiently and to reduce heat entering from the outside as much as possible.

Solution to Problem

A characteristic of the present invention resides in that a conductor panel of the capacitor module and a housing are thermally connected to each other by a cooling panel, an AC connection bus bar and the housing is thermally connected to each other by the cooling panel to release heat from the capacitor module and the AC connection bus bar to the housing via the cooling panel.

Advantageous Effects of Invention

According to the present invention, heat accumulated in the capacitor module and heat generated by the capacitor module by itself are transferred to the cooling panel from capacitor terminals or a conductive surface thereof and then is further transferred to the housing. The temperature of the housing is lower than that of the capacitor module because the housing is cooled by air in the periphery thereof or a cooling medium, so that the heat of the capacitor module flows to the housing efficiently by the difference in temperature gradient.

In the same manner, the heat from the outside flowing into the AC connection bus bar from an AC terminal is transferred to the cooling panel, and is further transferred to the housing. The temperature of the housing is lower than that of the AC connection bus bar because the housing is cooled by air in the periphery thereof or the cooling medium, so that the heat of the AC connection bus bar flows to the housing efficiently by the difference in temperature gradient.

DESCRIPTION OF EMBODIMENTS

Figure 1:
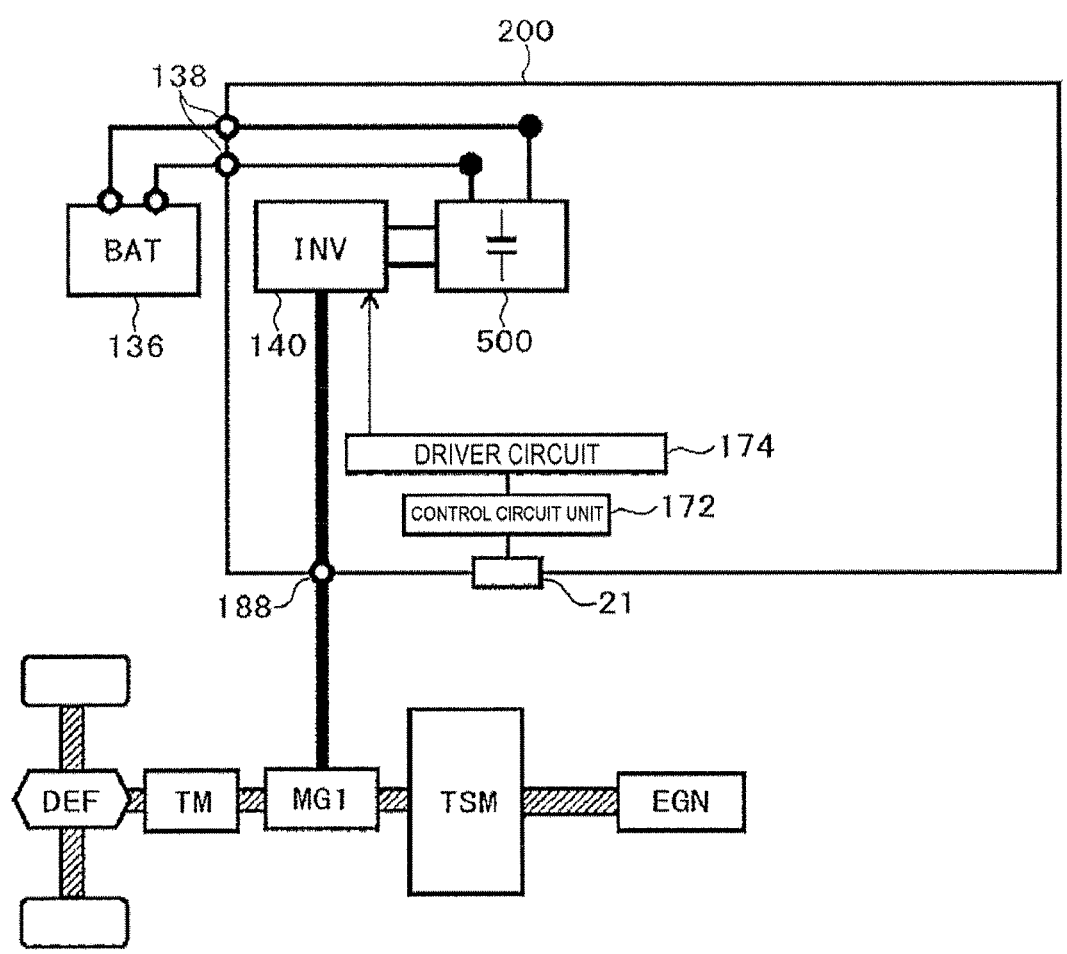
FIG. 1 is a system diagram illustrating a system of a hybrid automotive vehicle.

Subsequently, an embodiment of the present invention will be described with reference to the drawings. FIG. 1 is a system drawing illustrating a case where the power converter intended by the present invention is applied to a so-called hybrid system automotive vehicle by using both an internal combustion engine and an electric motor.

Although the power converter of the present invention may be applied not only to the hybrid system automotive vehicles, but also to so-called electric automotive vehicles which travel only with electric motors, and may also be used as the power converter for driving an electric motor used in general industrial machines, the power converter applied to the hybrid system automotive vehicle will be described as a representative example.

FIG. 1 is a drawing illustrating a control block of the hybrid system automotive vehicle, and an internal combustion engine EGN and a motor generator MG are motive power sources that generate a traveling torque of automotive vehicle. The motor generator MG has not only a function to generate a rotational torque, but also a function to convert a mechanical energy (rotational force) applied to the motor generator MG from the outside into a power.

The motor generator MG is, for example, a synchronous motor/generator, or an induction motor/generator, and acts as an electric motor and as a generator depending on an operating method as described above. When mounting the motor generator MG on an automotive vehicle, it is desirable to obtain high power with a compact profile, and a permanent magnet type synchronous electric motor using a magnet such as neodymium is suitable. The permanent magnet type synchronous electric motors generate less heat from a rotor in comparison with induced electric motors and, from this point of view, is superior as for the automotive vehicle.

An output side of the internal combustion engine EGN is transferred to the motor generator MG via a motive power transfer mechanism TSM, and a rotational torque from the motive power transfer mechanism TSM or a rotational torque generated by the motor generator MG is transmitted to a wheel via a transmission TM and a differential gear DEF.

In contrast, when operating in regenerative braking, a rotational torque is transmitted from the wheel to the motor generator MG, and AC power is generated on the basis of the transmitted rotational torque. The generated AC power is converted to DC power by a power converter 200, and charges a high-voltage battery 136, and the charged power is used again as traveling energy as described later.

Subsequently, the power converter 200 will be described. An inverter circuit unit 140 is electrically connected to the battery 136 via a DC connector 138, and mutual transmission of power is performed between the battery 136 and the inverter circuit unit 140.

When operating the motor generator MG as the electric motor, the inverter circuit unit 140 generates AC power on the basis of DC power supplied from the battery 136 via the DC connector 138, and supplies the AC power to the motor generator MG via an AC terminal 188. A configuration composed of the motor generator MG and the inverter circuit unit 140 acts as a motor/generator unit.

The motor/generator unit is operated as the electric motor or as the power generator, or as both of them by selecting one of those depending on the operating state. In this embodiment, by operating the motor/generator unit as a power unit by a power of the battery 136, the vehicle can be driven only by motive power of the motor generator MG. Furthermore, charging of the battery 136 is achieved in this embodiment by generating power by activating the motor/generator unit by motive power of the internal combustion engine EGN or by motive power of the vehicle as the power generating unit.

The power converter 200 includes a capacitor module 500 for smoothing DC power to be supplied to the inverter circuit unit 140.

The power converter 200 includes a communication connector 21 for receiving a command from a high-order control apparatus, or transmitting data that indicates the state to a high-order control apparatus. The amount of control by the motor generator MG is calculated by a control circuit unit 172 on the basis of the command input from the connector 21.

Furthermore, whether operating as the electric motor or operating as the power generator is calculated and, on the basis of the result of calculation, a control pulse is generated and the control pulse is supplied to a driver circuit 174. On the basis of the control pulse, the driver circuit 174 generates a drive pulse for controlling the inverter circuit unit 140.

The inverter circuit unit 140, the control circuit unit 172, the driver circuit 174, and the capacitor module 500 which constitute the power converter 200 are stored in a housing formed of aluminum alloy as described later, and are configured to be cooled by a cooling medium (for example, cooling water).

Figure 2:
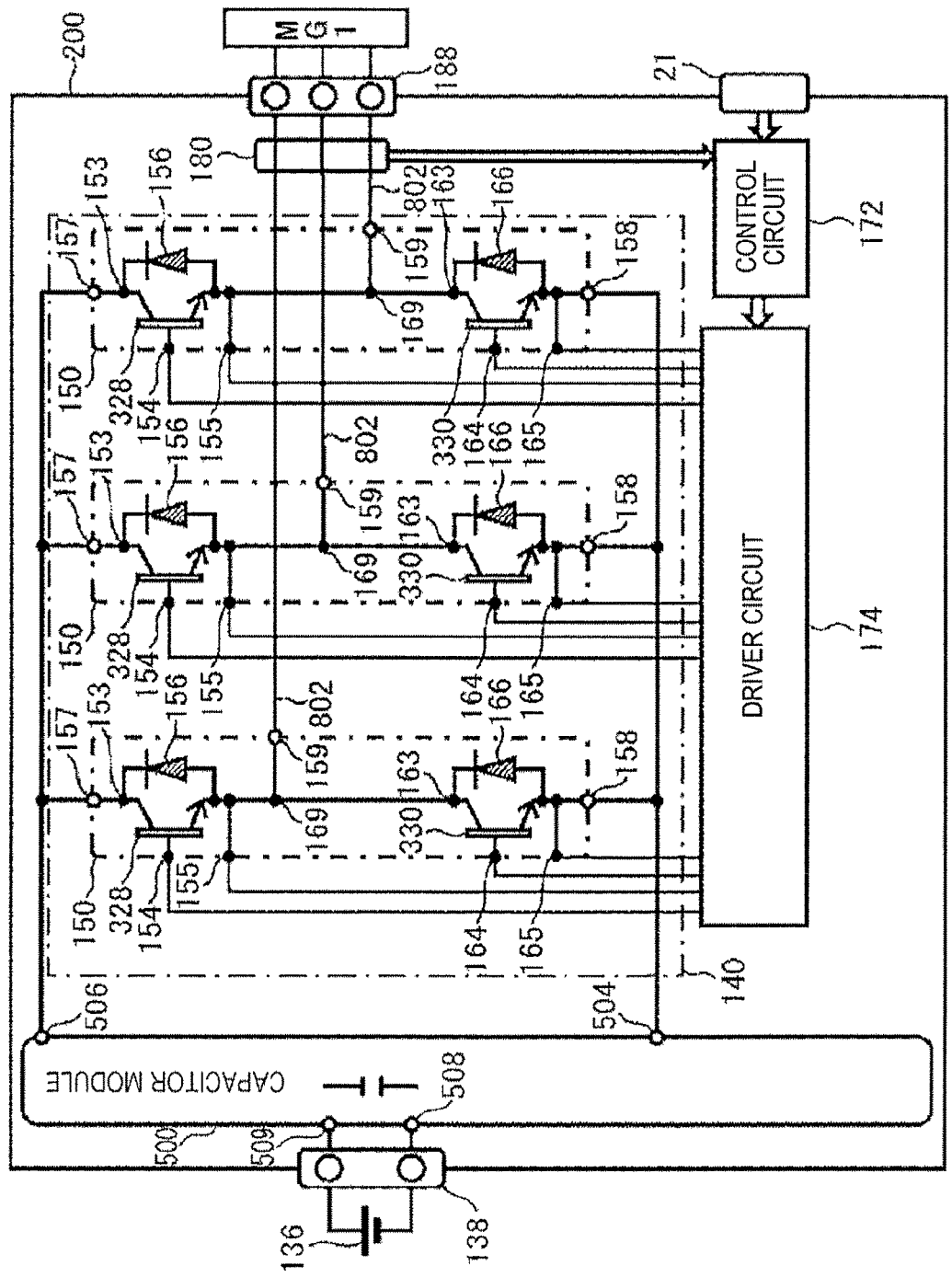
FIG. 2 is a circuit diagram illustrating a configuration of an electric circuit illustrated in FIG. 1.

Subsequently, a circuit configuration of the inverter circuit unit 140 will be described with reference to FIG. 2. An insulting gate type bipolar transistor is used as a semiconductor element, and is abbreviated as IGBT hereinafter.

The inverter circuit unit 140 includes power modules 150 having upper and lower arms each including an IGBT 328 and a diode 156 which act as an upper arm, an IGBT 330 and a diode 166 which act as a lower arm corresponding to three phases, namely a U-phase, a V-phase, and a W-phase of the AC power to be output.

Three phases in this embodiment correspond to respective winding wires of the respective three phases of an armature winding wire of the motor generator MG. The power modules 150 of three phases having the upper and lower arms each output an AC current from an intermediate electrode 169, which is an intermediate point portion between the IGBT 328 and the IGBT 330 of the each power module 150. The AC current is connected to an AC bus bar, which is an AC power line to the motor generator MG, through the AC terminal 159 and the AC connector 188.

Each of a collector electrode 153 of the IGBT 328 of the upper arm is electrically connected to a capacitor terminal 506 on the positive side of the capacitor module 500 via a positive terminal 157, and an emitter electrode of the IGBT 330 of the lower arm is electrically connected to a capacitor terminal 504 on the negative side of the capacitor module 500 via a negative terminal 158.

As described above, the control circuit unit 172 receives a control command from the high-order control apparatus via the connector 21 and, on the basis of the control command, generates a control pulse, which is a control signal for controlling the IGBTs 328 and the IGBTs 330 which constitute the upper arms and the lower arms of the power modules 150 of the respective phases that constitute the inverter circuit unit 140 and supplies the same to the driver circuit 174.

The driver circuit 174 supplies a drive pulse for controlling the IGBTs 328 and the IGBTs 330 which constitute the upper arms and the lower arms of the power modules 150 of the respective phases to the IGBTs 328 and the IGBTs 330 of the respective phases on the basis of the control pulse.

The IGBTs 328 and the IGBTs 330 each perform conducting or braking operation on the basis of the drive pulse from the driver circuit 174, and convert the DC power supplied from the battery 136 into three-phase AC power. The converted power is supplied to the motor generator MG1.

The IGBT 328 includes the collector electrode 153, a signal emitter electrode 155, and a gate electrode 154. The IGBT 330 includes a collector electrode 163, a signal emitter electrode 165, and a gate electrode 164.

The diode 156 is electrically connected between the collector electrode 153 and the emitter electrode. The diode 166 is electrically connected between the collector electrode 163 and the emitter electrode.

As a switching power semiconductor element, a metal-oxide semiconductor field-effect transistor (hereinafter, abbreviated as MOSFET) may be used. In this case, the diode 156 and the diode 166 are not necessary. As the switching power semiconductor element, the IGBT is suitable when the DC voltage is relatively high, and the MOSFET is suitable when the DC voltage is relatively low.

The capacitor module 500 includes a plurality of positive side capacitor terminals 506, a plurality of negative side capacitor terminals 504, a positive side power source terminal 509, and a negative side power source terminal 508. The high-voltage DC power from the battery 136 is supplied to the positive side power source terminal 509 and the negative side power source terminal 508 via the DC connector 138, and is supplied from the plurality of the positive side capacitor terminals 506 of the capacitor module 500 and the plurality of the negative side capacitor terminals 504 to the inverter circuit unit 140.

In contrast, the DC power converted from the AC power by the inverter circuit unit 140 is supplied from the positive side capacitor terminals 506 and the negative side capacitor terminals 504 to the capacitor module 500, and is supplied from the positive side power source terminal 509 and the negative side power source terminal 508 to the battery 136 via the DC connector 138, and is accumulated in the battery 136.

The control circuit unit 172 includes a microcomputer (hereinafter, referred to as MICON) for arithmetic processing of switching timing of the IGBTs 328 and the IGBTs 330. Examples of information to be input to MICON include a target torque value required from the motor generator MG, a current value supplied from the power modules 150 having the upper and lower arms to the motor generator MG, and a position of a magnetic pole of a rotor of the motor generator MG1.

The target torque value is based on the command signal output from the high-order control apparatus, which is not illustrated, and the current value is detected on the basis of a detection signal of the current sensor. The position of a magnetic pole is detected on the basis of the detection signal output from a rotating magnetic pole sensor (which is not illustrated) such as a resolver provided on the motor generator MG1.

In this embodiment, a case where a current sensor detects the three-phase current values is exemplified. However, a configuration in which the current values of two phases are detected and the current values of three phases are obtained by calculation is also applicable.

The MICON in the control circuit unit 172 calculates d-q axes current command values of the motor generator MG on the basis of the target torque value, calculates d-q axes voltage command values on the basis of a differential between the calculated d-q axes current command values and the detected d-q axes current value, and converts the calculated d-q axes voltage command values into voltage command values of U-phase, V-phase, and W-phase on the basis of the detected position of a magnetic pole.

The MICON generates a pulsed modulation wave on the basis of comparison between a basic wave (sinusoidal wave) on the basis of the voltage command values of U-phase, V-phase, and W-phase and a carrier wave (triangle wave), and outputs the generated modulation wave to the driver circuit 174 as a PWM (pulse-width modulation) signal.

When driving the lower arms, the driver circuit 174 outputs a drive signal, which is an amplified PWM signal, to the gate electrodes of the IGBTs 330 of the corresponding lower arms. When driving the upper arms, the driver circuit 174 shifts the level of a reference potential of the PWM signal to a level of a reference potential of the upper arms, then amplifies the PWM signal, and then outputs the same to the gate electrodes of the IGBTs 328 of the corresponding upper arms as drive signals, respectively.

The control circuit unit 172 performs an abnormal detection (excess current, excess voltage, excess temperature, and so forth), and protects the power modules 150 having the upper and lower arms. Therefore, sensing information is input to the control circuit unit 172. For example, information on a current flowing in the emitter electrodes of the IGBTs 328 and the IGBTs 330, respectively, is input to the corresponding excess current detectors (which are not illustrated) from the signal emitter electrodes 155 and the signal emitter electrodes 165 of the respective arms.

Accordingly, the respective excess current detectors performs excess current detection and, when the excess current is detected, stops switching operation of the corresponding IGBT 328 and IGBT 330, and protects the corresponding IGBT 328 and IGBT 330.

Information on the temperature of the power modules 150 having the upper and lower arms are input into the MICON from temperature sensors (which are not illustrated) provided on the power modules 150 having the upper and lower arms. Information on the voltage on the side of the DC positive side of the power modules 150 having the upper and lower arms is input to the MICON. The MICON performs excess temperature detection and excess voltage detection on the basis of such information and, when the excess temperature or the excess voltage is detected, stops switching operation of all of the IGBTs 328 and the IGBTs 330.

In the power converter 200 having the configuration as described above, in the interior of the housing of the power converter, many electronic components, for example, IGBT and the like that generate a high calorific power are used in many cases. Therefore, there is a phenomena that the interior of the housing assumes a high-temperature environment due to the heat generation or the like from the electronic components. In addition, a conductive wire having good heat conductivity, which is electrically connected to the electric motor, is connected. Therefore, there is a phenomena that heat of the electric motor enters a bus bar of the power converter via the conductive wire and, this heat enters the inverter circuit unit, and depending on the case, to the capacitor module to increase the temperature in the interior of the housing of the power converter as a result.

As described above, in the power converter having such a configuration, cooling of the power converter is extremely important in order to improve power conversion efficiency. Specifically, the DC smoothing capacitor module stored in the housing of the power converter is heat-sensitive, and in order to secure the performance, efficient cooling of the capacitor module is required. Also, a reduction of heat entering from the outside as much as possible is required.

The present invention is intended to provide a technology that fulfills one or both of needs to cool a capacitor module efficiently and to reduce heat entering from the outside as much as possible.

Subsequently, a cooling structure and a cooling method of the power converter, which is characteristics of the present invention, will be described in detail with reference to the drawings.

Figure 3:
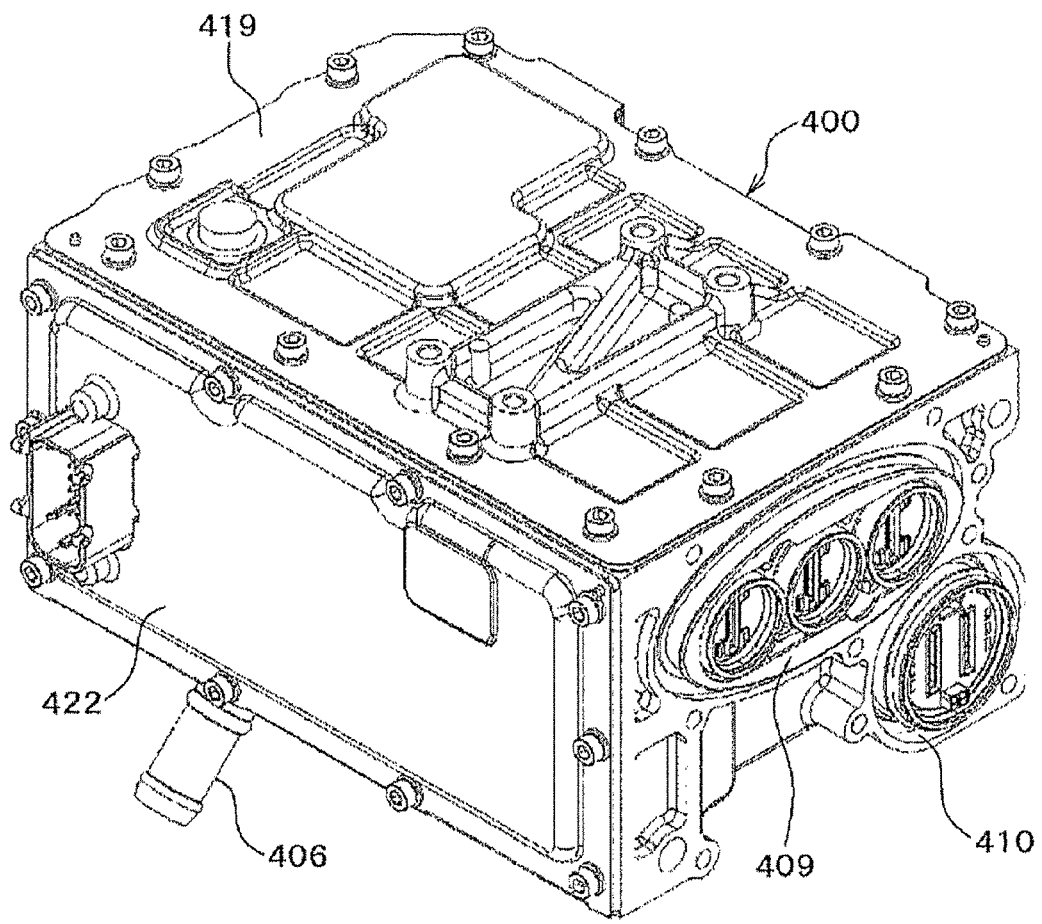
FIG. 3 is an appearance perspective view illustrating an external configuration of a power converter of an embodiment of the present invention.

FIG. 3 is an appearance drawing of the power converter 200. A housing 400 is formed into a parallelepiped box-shape formed of metal, for example, aluminum alloy, having a pair of short side wall portion and long side wall portion. One side surface includes a DC connection port 409 in which a DC terminal is stored, and an AC connection port 410 in which an AC terminal is stored formed thereon.

A lower cover 404 is fixed to a bottom portion of the housing 400, and a pipe 406 through which a cooling medium flows in and out is provided on the lower cover 404. The capacitor module 500, the inverter circuit unit 140, the control circuit unit 172, the driver circuit 174 and the like are stored in the housing 400.

Figure 4:
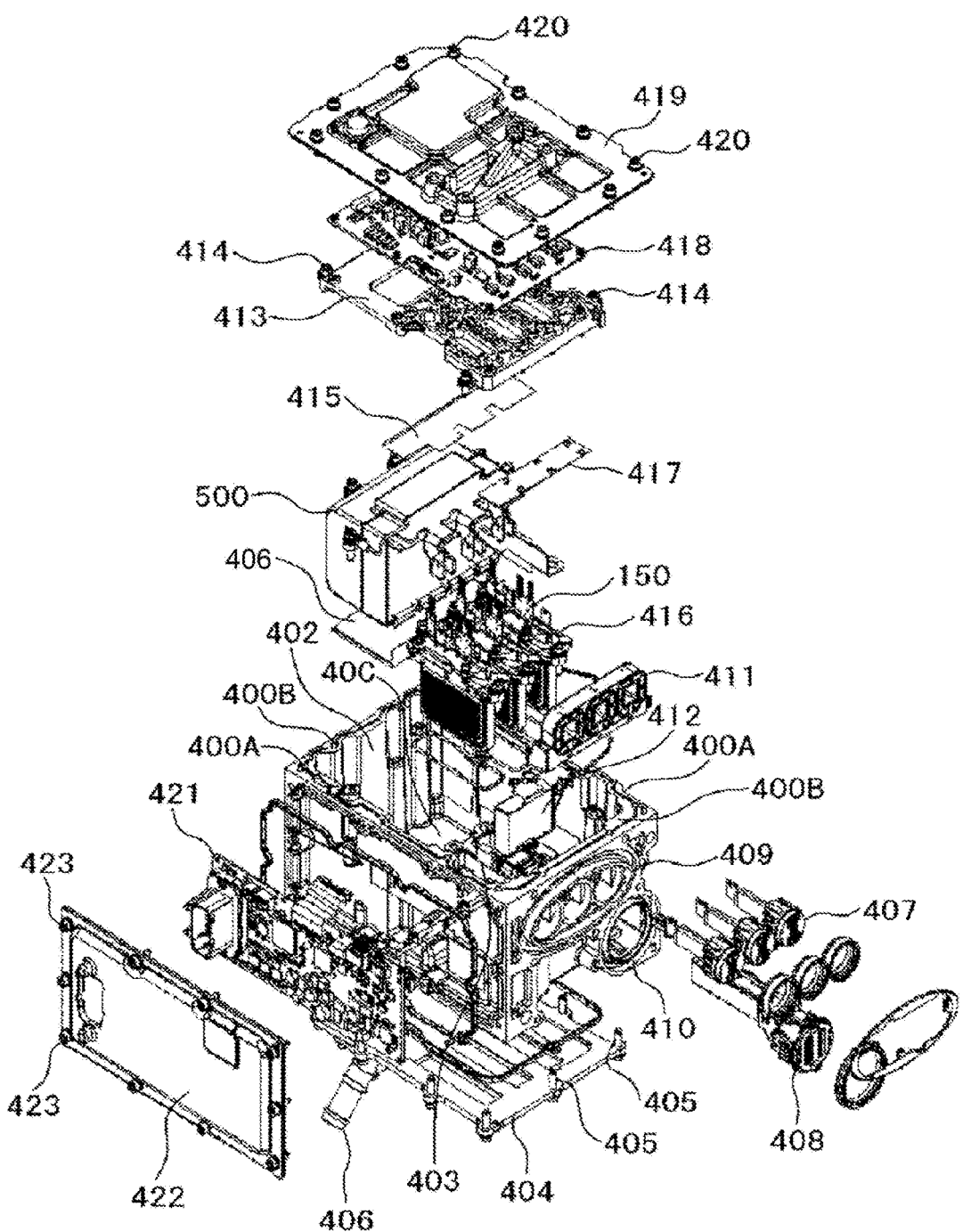
FIG. 4 is an exploded perspective view of components of the power converter illustrated in FIG. 3 viewed from the outside.
Figure 5:
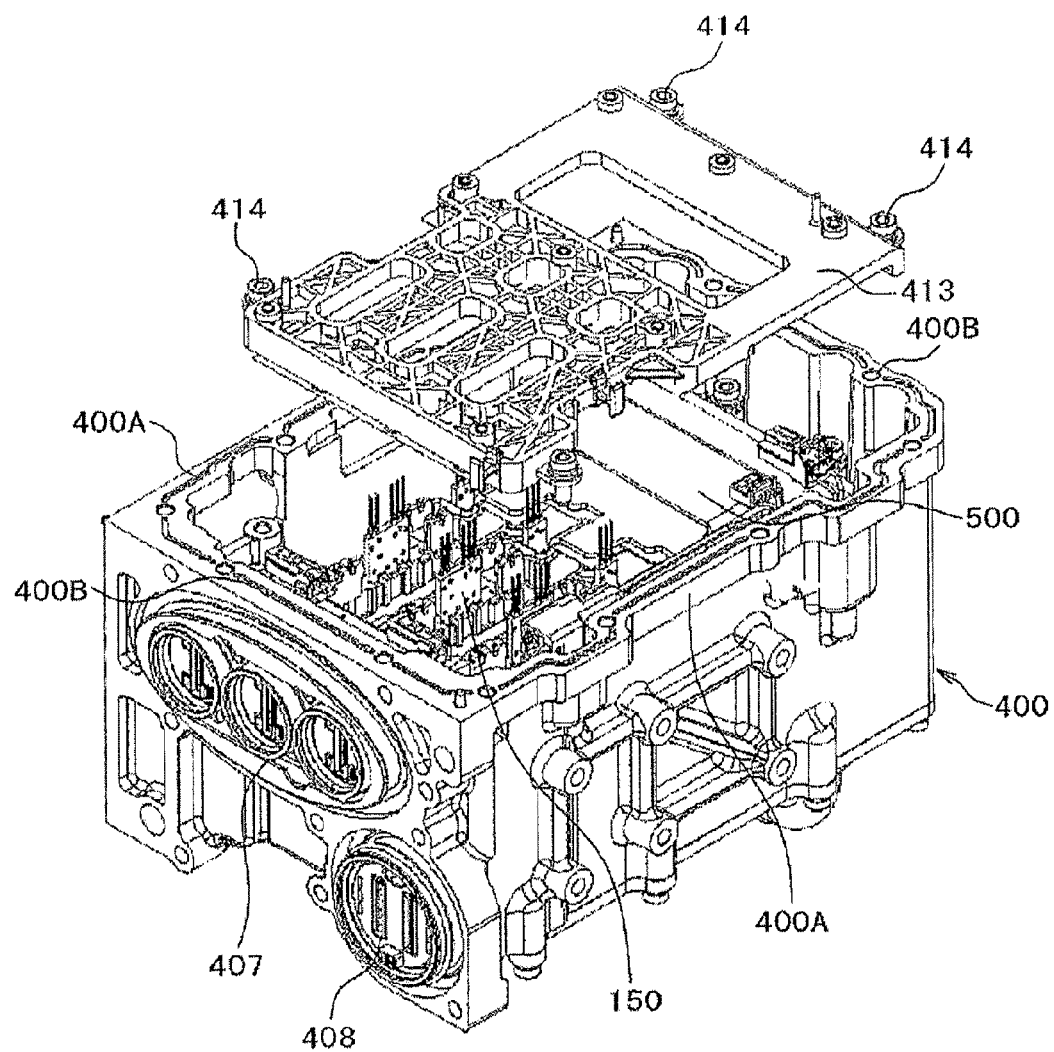
FIG. 5 is an appearance perspective view of a state in which an upper cover and a driver circuit substrate of the power converter illustrated in FIG. 3 is demounted.

FIG. 4 is a general configuration drawing presented as a perspective view by disassembling into components of the power converter 200 illustrated in FIG. 3, and FIG. 5 is a perspective view of the power converter when the upper cover and the driver circuit substrate are disassembled illustrated in FIG. 4.

Referring now to FIG. 4 and FIG. 5, a schematic configuration of the power converter 200, which is an example of the present invention, will be described and subsequently, a cooling structure and a cooling method of the power converter, which is characteristics of the present invention, will be described in detail.

In FIG. 4 and FIG. 5, reference numeral 400 denotes a housing formed of a metal (for example, aluminum alloy) for storing components of the power converter 200, which is formed into a rectangular box shape opening on top in the vertical direction, having a bottom wall portion including a pair of long side wall portions 400A and a pair of short side wall portions 400B. In the interior of the housing 400, a storage portion 402 configured to store the capacitor module 500, and a storage portions 403 configured to store the power modules 150 are formed.

The lower cover 404 is fixed firmly to the lower portion of the low wall portion 400C of the housing 400 with fixing screws 405, and a pipe 406 configured to allow the cooling medium to flow in and out is provided on the lower cover 404.

Therefore, the cooling medium flows in a cooling channel formed in a space between the lower cover 404 and the low wall portion 400C to cool the interior of the housing 400.

A capacitor module 500 is placed at a position interposed between one of the short side wall portions 400B and a pair of the long side wall portions 400A of the housing 400 on the low wall portion of the storage portion 402 formed in the interior thereof via a heat discharging sheet 406. The heat discharging sheet 406 has a heat discharging function for releasing heat of the capacitor module 500 to the low wall portion of the housing 400 and an insulating function.

At a position next to the capacitor module 500, three of the storage portions 403 for storing the three power modules 150 individually are formed. The storage portions 403 are opened to the cooling channel formed between the lower cover 404.

Therefore, the power modules 150 each have a liquid-tight configuration by itself, and specifically, is sealed by a seal packing or the like with respect to the storage portions 403. Therefore, the power modules 150 are configured to be cooled by coming into direct contact with the cooling medium. Such a configuration is known by above-described PTL 1 already applied by the present applicant, although the configuration is slightly different.

The storage portions 403 for the three power modules 150 are arranged in a line so as to oppose the other one of the short side wall portions 400B of the housing 400 on the side opposite to the capacitor module 500. In this configuration, AC terminals 407 and a DC terminal 408 are allowed to be stored from the same plane on the side of the short side wall portions 400B.

An AC side storage port 409 in which three AC terminals 407 are stored, and a DC side storage port 410 to which one DC terminal 408 is connected are formed on the short side wall portions 400B. Between the AC terminals 407 and the power modules 150 is connected by a panel-shaped AC connection bus bars 416, and as described later, a configuration in which heat entering from the outside via the conducting wire from the AC connection bus bars 416 is released toward the housing 400 is employed.

A current sensor 411 and a laminated conductor plate 412 are arranged in a space between the power modules 150 and the short side wall portions 400B of the housing 400.

A cooling board 413, which is a characteristic component of the present invention, is arranged on the capacitor module 500, the power modules 150, the current sensor 411, the laminated conductor plate 412 and the like so as to cover the same.

The cooling board 413 is placed on the long and short side wall portions 400A, 400B of the housing 400, and is fixed firmly with the housing 400 with fixing screws 414. By fixing firmly to the housing 400, heat from the capacitor module 500 and heat from the AC connection bus bars 416 are released to the housing 400.

A heat discharging sheet 415 is interposed between the capacitor module 500 and the cooling board 413, so that the heat of the capacitor module 500 is released to the cooling board 413.

A heat discharging sheet 417 is interposed between the AC connection bus bars 416 and the cooling board 413 of the power modules 150, so that heat of the electric motor flowing in from the AC terminal 408 is released to the cooling board 413 via the AC connection bus bars 416 and the heat discharging sheet 417.

Furthermore, by firmly fixing to the housing 400 with fixing screws 414, heat from the AC connection bus bars 416 is released to the housing 400.

A driver circuit substrate 418 on which the driver circuit 174 that drives the power modules 150 is mounted is arranged on the cooling board 413, and an upper cover 419 formed of aluminum alloy is firmly fixed further thereon to the housing 400 with fixing screws 420 so as to close an opening on top of the housing 400.

Moreover, a control circuit portion substrate 421 on which the control circuit unit 172 for controlling the driver circuit 174 is mounted is arranged on the long side wall portions 400A of the housing 400, and a side cover 422 formed of aluminum alloy is firmly fixed further thereon to the long side wall portions 400A of the housing 400 with fixing screws 423.

The schematic configuration of the power converter 200 according to an embodiment of the present invention has been described thus far. Subsequently, the characteristic components will be described in detail.

Figure 6:
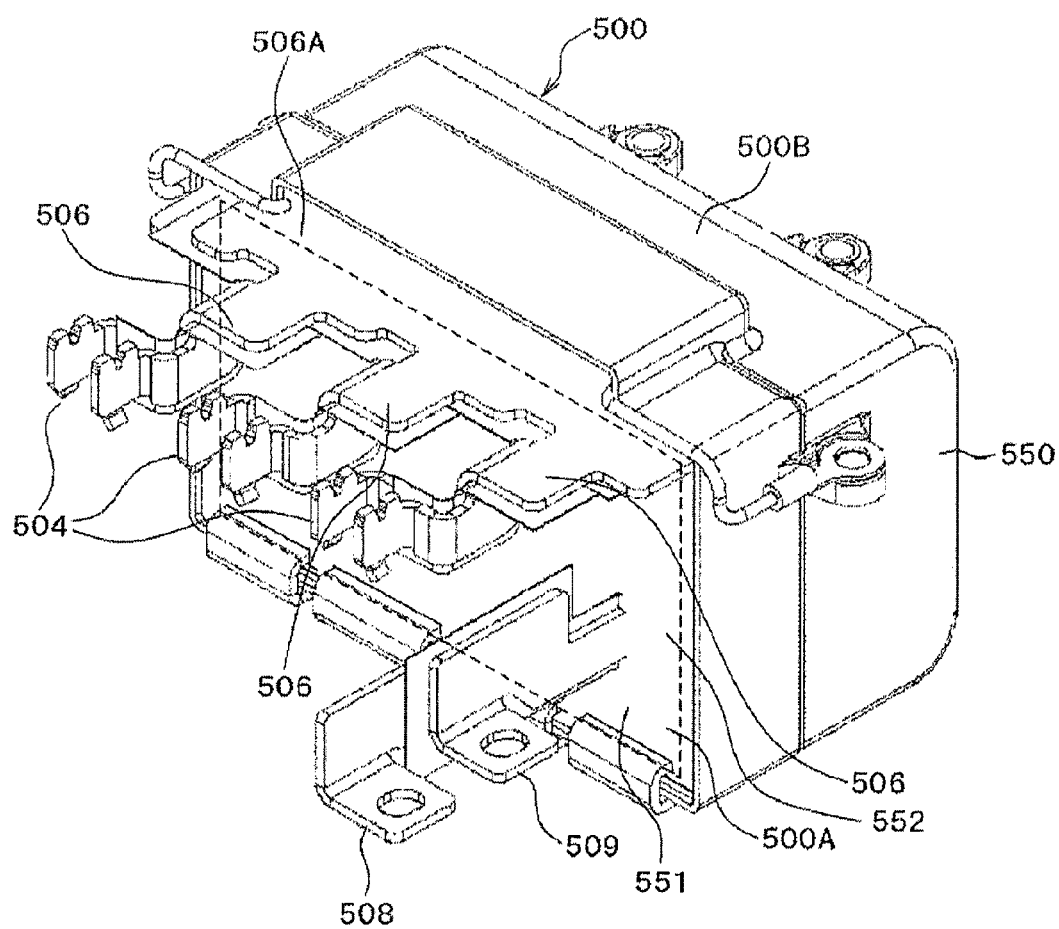
FIG. 6 is an appearance perspective view of a capacitor module newly developed to be used in the embodiment of the present invention.

FIG. 6 is the newly developed capacitor module 500 according to this embodiment, and the capacitor module 500 includes the plurality of (three) positive side capacitor terminals 506, the plurality of (three) negative side capacitor terminals 504, the positive side power source terminal 509, and the negative side power source terminal 508.

The high-voltage DC power from the battery 136 is supplied to the positive side power source terminal 509 and the negative side power source terminal 508 via the DC terminal 408, and the plurality of the positive side capacitor terminals 506 of the capacitor module 500 and the plurality of the negative side capacitor terminals 504 are connected to the power modules 150.

In the capacitor module 500, the positive side capacitor terminals 506, the negative side capacitor terminals 504, the positive side power source terminal 509, and the negative side power source terminal 508, which are all of the terminals, are provided so as to project from one of the side surface portions 500A, specifically, the side surface portion 500A in the direction where the power modules 150 are installed as illustrated in FIG. 5.

In this manner, mutual current flows among the respective phases (U-phase, V-phase, and W-phase) is reduced by providing all of the terminals on one of the side surface portions 500A. Consequently, heat generated by the mutual current is reduced, and hence a phenomenon that heat is accumulated in the interior of the capacitor module 500 may be restrained. A connecting structure with respect to the power modules 150 may also be simplified, and the distance of connection wiring may be reduced.

The positive side capacitor terminals 506, the negative side capacitor terminals 504, the positive side power source terminal 509, and the negative side power source terminal 508 are arranged in this order from the upper side on the side surface portion 500A of the capacitor module 500, and conductive surfaces 506A of the uppermost positive side capacitor terminals 506 are formed so as to be substantially flush with an upper surface portion 500B of the capacitor module 500. Therefore, the positive side capacitor terminals 506 constitute part of a heat discharging channel to the cooling board 413.

In this embodiment, respective terminals, namely, the negative side conductor plate and the positive conductor plate of the capacitor, the positive side capacitor terminals 506, the negative side capacitor terminals 504, the positive side power source terminal 509, and the negative side power source terminal 508 are formed of an integrally formed metal plates such as copper.

The capacitor module 500 includes a capacitor element, a case 550 configured to store the capacitor element, and a resin sealing material 551 to be filled in a storage space in the case 550. An exposed surface 552 is a surface of the resin sealing material 551 exposed from the case 550. The case 550 is arranged on the side of the power modules 150 so that the exposed surface 552 and the power modules 150 oppose each other. The positive side capacitor terminals 506 and the negative side capacitor terminals 504 are required to restrain an increase of bent portions from an improvement of productivity point of view. The positive side capacitor terminals 506 and the negative side capacitor terminals 504 are required to restrain an increase in length of the capacitor terminal from a reduction of inductance point of view. Accordingly, the positive side capacitor terminals 506 and the negative side capacitor terminals 504 project from the exposed surface 552 in parallel to a cooling surface of the cooling board 413 with respect to the positive side capacitor terminals 506, and are connected to the power modules 150. By restraining the increase of the bent portion of the capacitor terminals, the reduction of a contact surface between the cooling board and the capacity terminals is restrained.

Figure 7:
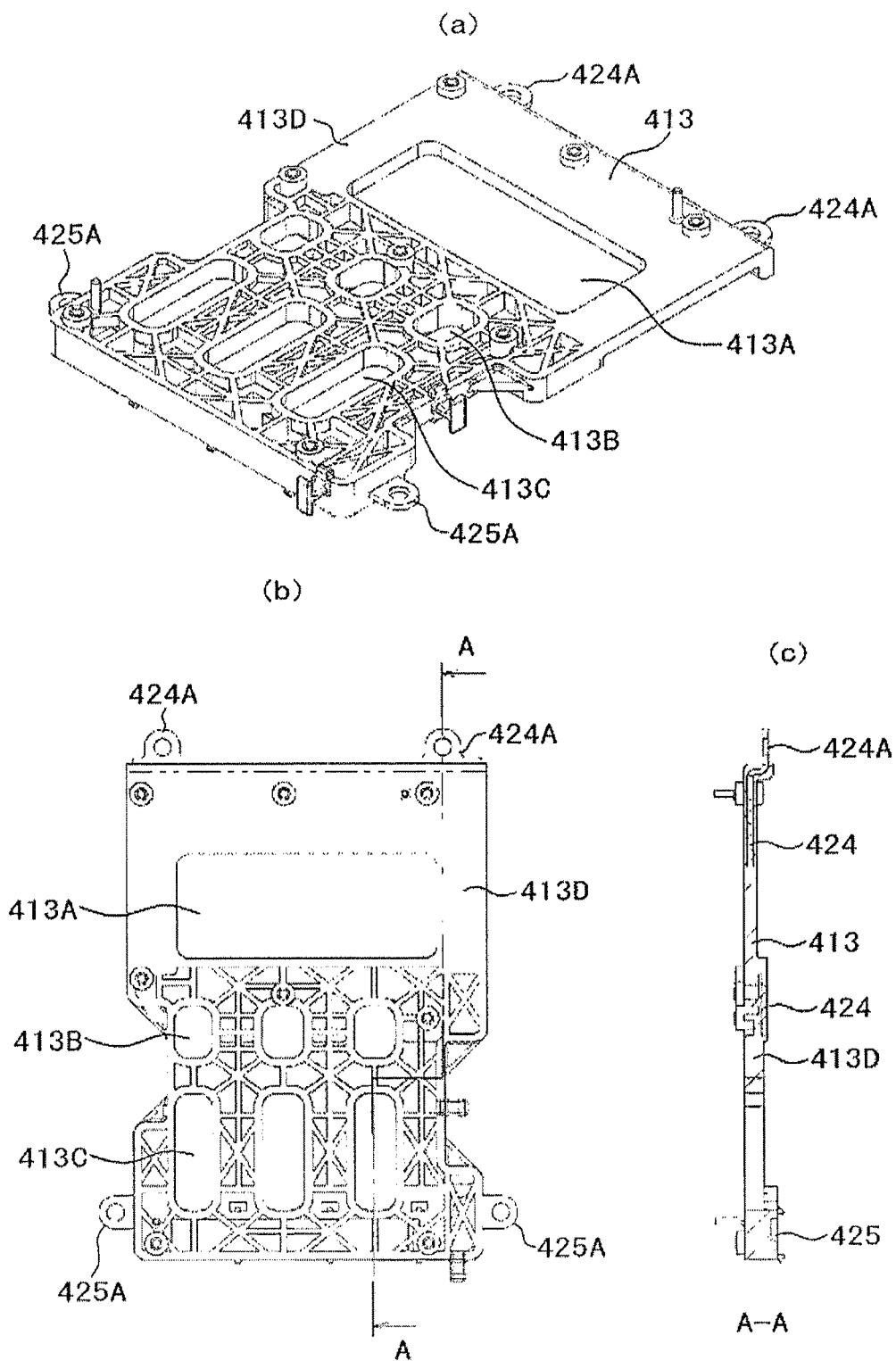
FIG. 7 is a drawing illustrating a cooling board newly developed to be used in the embodiment of the present invention, in which (a) is an appearance perspective view viewed from obliquely above, (b) is a front view thereof, and (c) is a cross-sectional view taken along the line A-A of the front view.

FIG. 7 illustrates a configuration of the cooling board 413, in which (a) is an appearance perspective view of the entire portion, (b) is a front view viewed from above, and (c) is a cross-sectional view taken along the line A-A. As is clear from these drawings, an opening 413A which allows storage of an upper portion of the capacitor module 500, and openings 413B, 413C which allow passage of connecting terminals of electronic components such as the power modules 150 are formed in the cooling board 413. The cooling board 413 is entirely formed of a synthetic resin 413D, and two panels, namely, a cooling panel 424 and a cooling panel 425 are embedded in the interior thereof by insert molding.

The reason why the cooling panel 424 and the cooling panel 425 are insert-molded by molding with the synthetic resin 413D is to attain the insulation of the electronic components and the connection wiring arranged in the interior of the housing 400 from the cooling panel 424 and the cooling panel 425.

The cooling panel 424 is a cooling panel for releasing heat from the capacitor module 500, and the cooling panel 425 is a cooling panel for releasing heat from the AC connection bus bars 416. The cooling panel 425 also has a function to release heat generated in the power modules 150 when the temperature of the power modules 150 is further increased.

The cooling panel 424 and the cooling panel 425 are covered with the synthetic resin 413A entirely as described above, but only the sides of bottom surface portions thereof are configured to be exposed to allow heat to enter. Furthermore, mounting portions 424A and mounting portions 425A are formed on the cooling panel 424 and the cooling panel 425 so as to project from synthetic resin portion 413D of the cooling board 413, and are provided with holes formed to allow fixing screws for mounting to pass therethrough in the interior thereof.

Therefore, heat entering from the exposed bottom surface portions of the cooling panel 424 and the cooling panel 425 embedded in the cooling board 413 is released from the mounting portions 424A and the mounting portions 425A of the cooling panel 424 and the cooling panel 425 to the housing 400.

Figure 8:
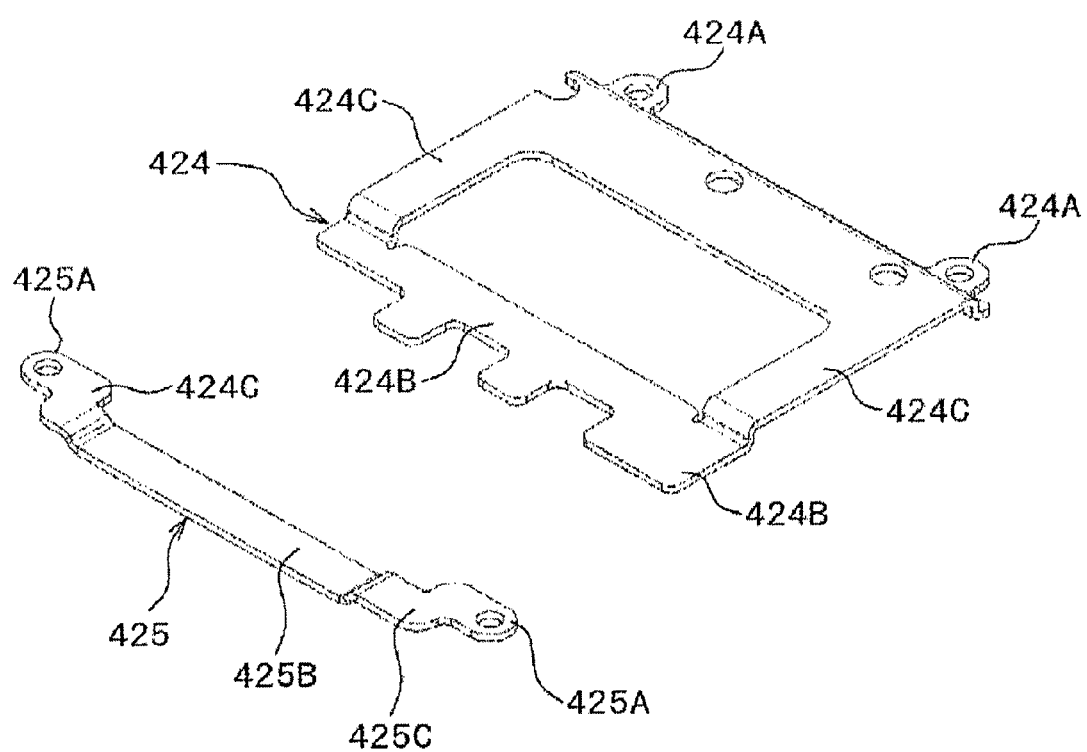
FIG. 8 is an appearance perspective view of a cooling panel illustrated in FIG. 7 viewed obliquely from above.

FIG. 8 is an appearance perspective view illustrating the cooling panel 424 and the cooling panel 425 in detail. The cooling panel 424 on the capacitor module 500 side is opened at the center, and a heat receiving portion 424B configured to receive heat from the plurality of the positive side capacitor terminals 506 side of the capacitor module 500, a heat transmitting portion 424C, and a mounting portions 424A, which is a heat discharging portion, are formed so as to surround the opening.

The cooling panel 425 on the AC connection bus bars 416 side is formed into a straight plate-shape, and includes a heat receiving portion 425B configured to receive heat from the AC connection bus bars 416 side, heat transmitting portions 425C, and mounting portions 425A, which is a heat discharging portion.

The cooling panel 424 and the cooling panel 425 are formed of a high heat transmitting member having a superior heat transmitting property and, in this embodiment, aluminum having a plate thickness of 2 mm is used. If further heat dissipation (high heat conductive property) is required, copper material may be used.

Although the cooling panel 424 and the cooling panel 425 are separate members and are integrated with the synthetic resin 413D, a configuration in which the cooling panel 424 and the cooling panel 425 are integrally punched by a punching machine, and are insert-molded together with the synthetic resin 413D is also applicable.

The metallic material has been proposed as a material which can be insert-molded with the synthetic resin. However, in the case where other non-metallic materials having a high heat transmitting property is used, a configuration in which the cooling board 413 may be formed by adhesion or fixing screws instead of the insert molding. In this case, the shapes of the cooling panel 424 and the cooling panel 425 may be the same as those illustrated in FIG. 8.

Figure 9:
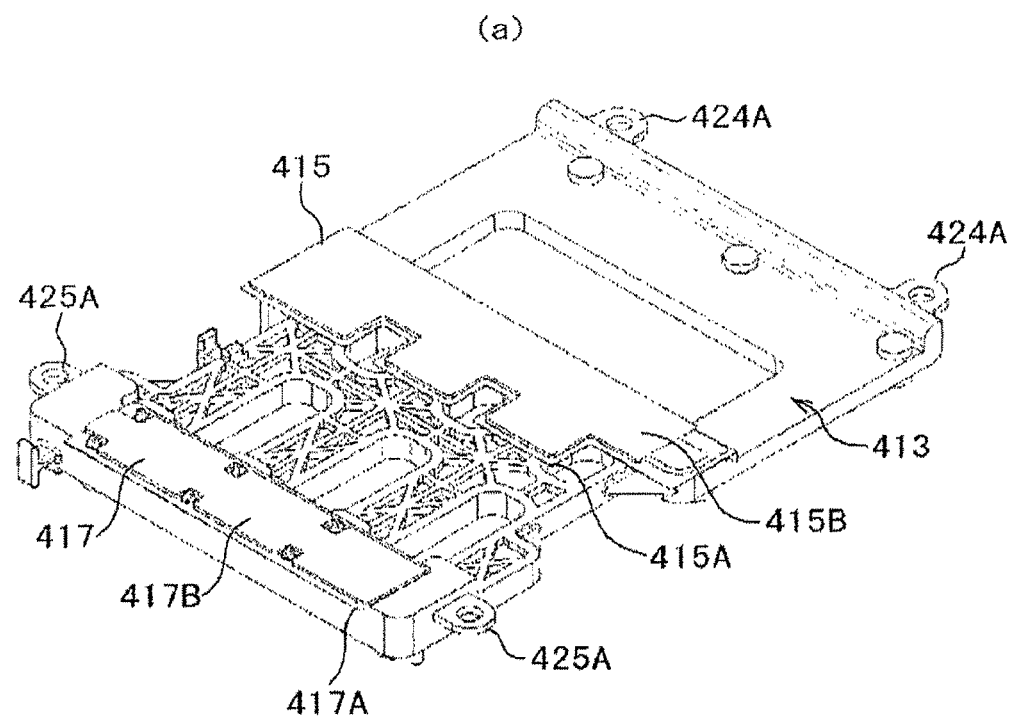
FIG. 9 is an appearance perspective view of a back surface of the cooling board newly developed to be used in the embodiment of the present invention viewed obliquely from above.
Figure 9:
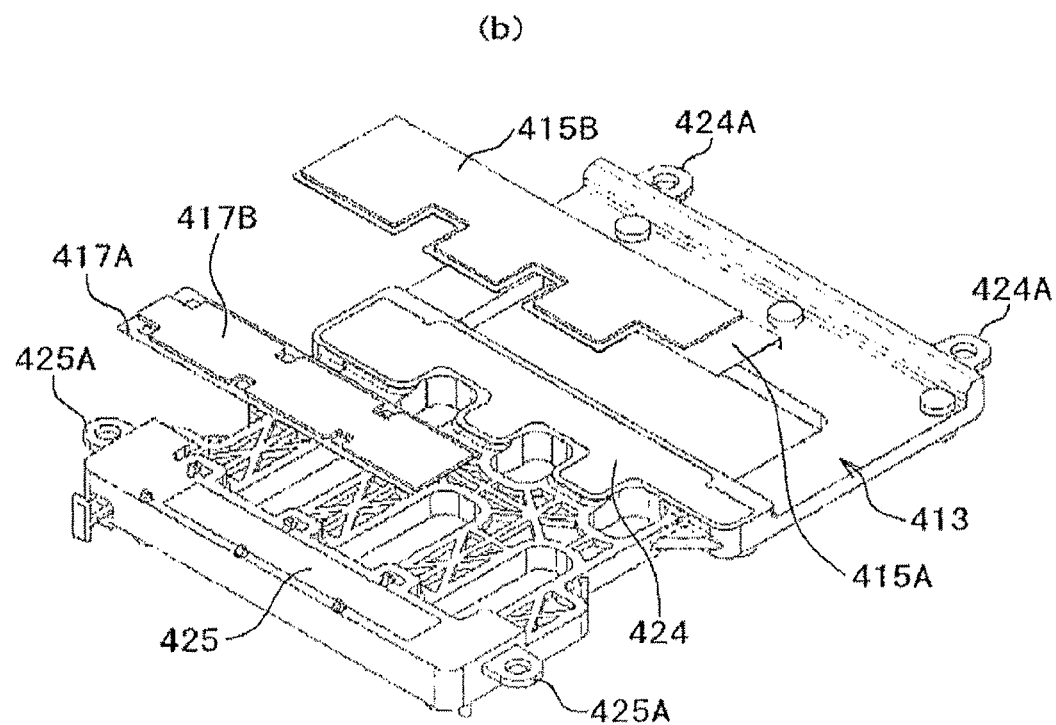

FIG. 9 is an appearance perspective view of the cooling board 413 viewed from the back, in which (a) illustrates a state in which the heat discharging sheet is mounted, and (b) illustrates a state in which the heat discharging sheet is disassembled.

In FIG. 9, the heat discharging sheet 415 on the capacitor module 500 side is formed of a composite sheet including an insulating sheet portion 415A formed into a shape slightly larger than the shape of the heat receiving portion 424B of the cooling panel 424, and a heat discharging sheet portion 415B also formed into a shape slightly larger than the shape of the heat receiving portion 424B of the cooling panel 424. The insulating sheet portion 415A is located on the heat receiving portion 424B side and the heat discharging sheet portion 415B is located on the positive side capacitor terminals 506 side.

As a material of the heat discharging sheet 415, PET (polyethylene terephthalate) is used as the insulating sheet portion 415A, reduced in thickness as much as possible for increasing the heat-discharging property. The one having a thickness of 0.1 mm is used. A silicon-based resin material is used for the heat discharging sheet portion 415B and the one having a thickness of 1.0 mm is used.

A heat discharging sheet 417 on the AC connection bus bars 416 side is formed of a composite sheet including an insulating sheet portion 417A formed into a shape slightly larger than the shape of the heat receiving portion 425B of the cooling panel 425, and a heat discharging sheet portion 417B also formed into a shape slightly larger than the shape of the heat receiving portion 425B of the cooling panel 425. The insulating sheet portion 415A is located on the heat receiving portion 425B side and the heat discharging sheet portion 417B is located on the AC connection bus bars 416 side.

As a material of the heat discharging sheet 417, PET (polyethylene terephthalate) is used as the insulating sheet portion 417A, reduced in thickness as much as possible for increasing the heat-discharging property. The one having a thickness of 0.1 mm is used. A silicon-based resin material is used for the heat discharging sheet portion 417B and the one having a thickness of 1.0 mm is used.

The heat discharging sheet 415 and the heat discharging sheet 417 are characterized by having flexibility, and are configured to come into tight contact with the heat receiving portions 424B, 425B of cooling panels 424, 425, respectively, the positive side capacitor terminals 506, and the AC connection bus bars 416 by this flexibility. In this configuration, heat transmitting efficiency is improved.

The heat discharging sheet 415 and the heat discharging sheet 417 as described above are not limited to the material or the thickness described above, and other materials or specifications may be selected and employed as needed. However, these are desirable as the actual material from the past record of actual use point of view.

The heat discharging sheet 415 and the heat discharging sheet 417 are expected to have an effect of allowing quick mounting by being adhered in advance to the cooling board 413 before assembling the cooling board 413 into the housing 400.

Subsequently, a state in which the above-described newly developed capacitor module 500 and the cooling board 413 are integrated into the housing 400 will be described.

Figure 10:
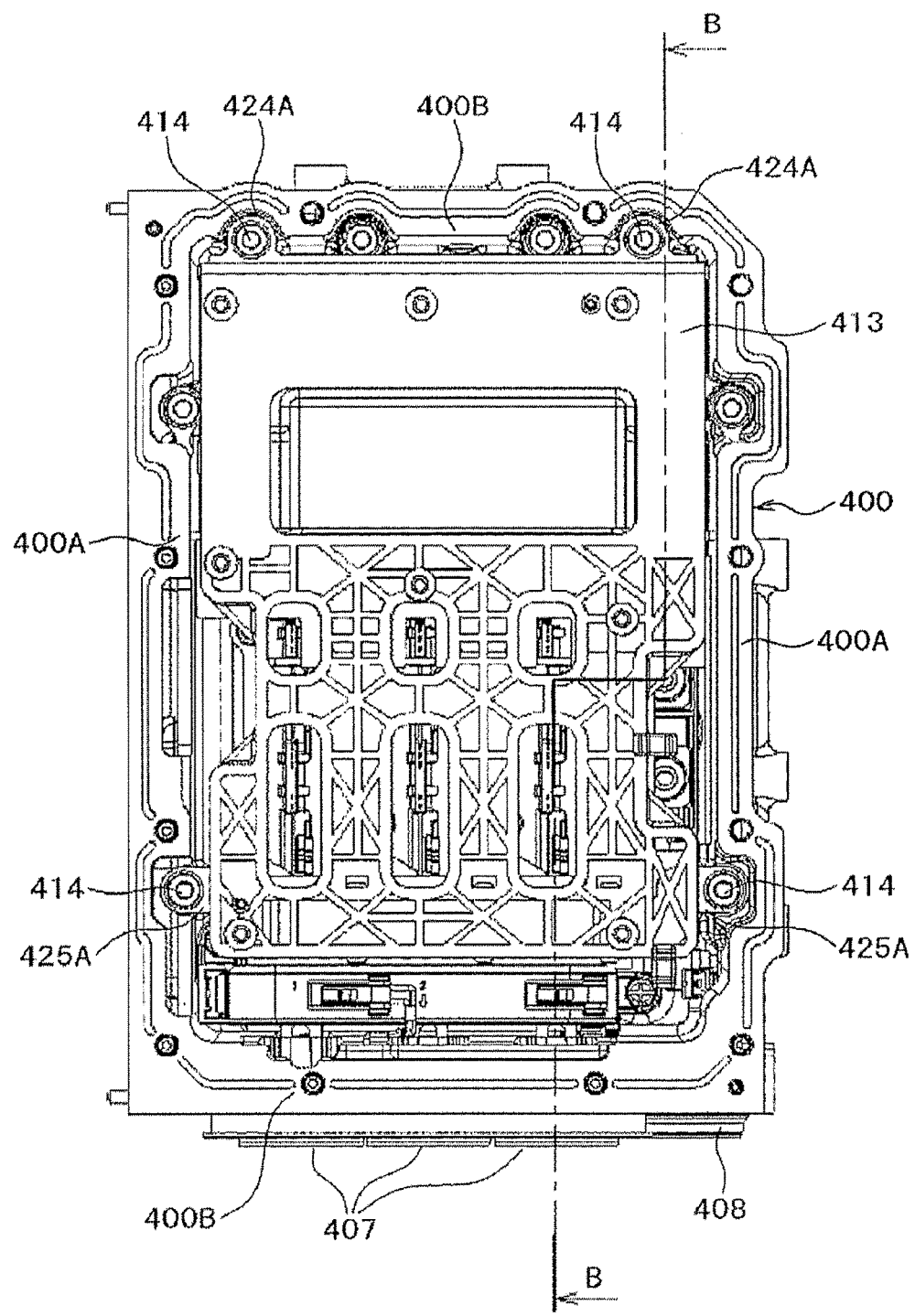
FIG. 10 is a front view of the power converter of the embodiment of the present invention in a state in which the upper cover and the driver circuit substrate is demounted.
Figure 11:
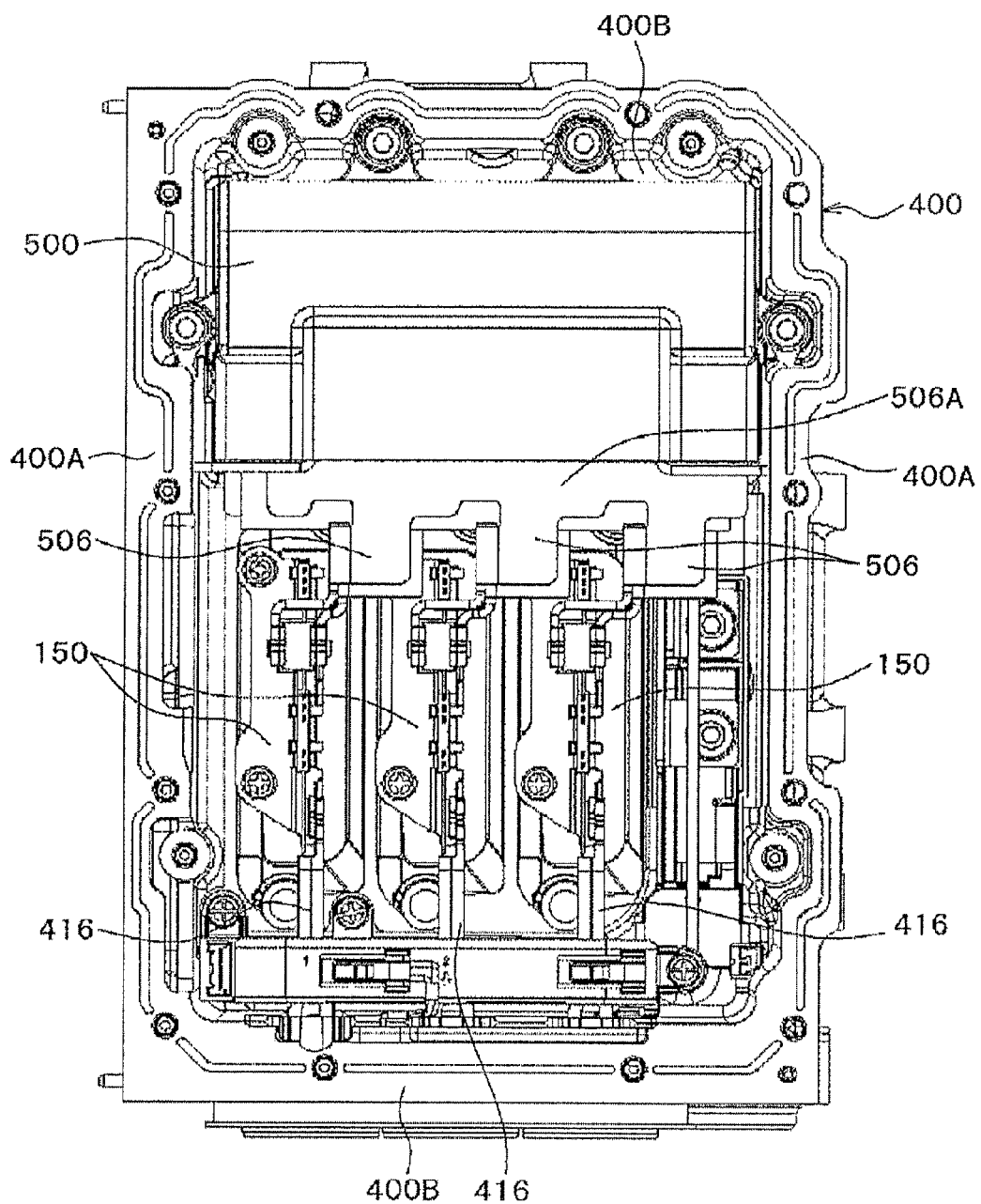
FIG. 11 is a front view of the power converter illustrated in FIG. 10 in a state in which the cooling board is demounted.
Figure 12:
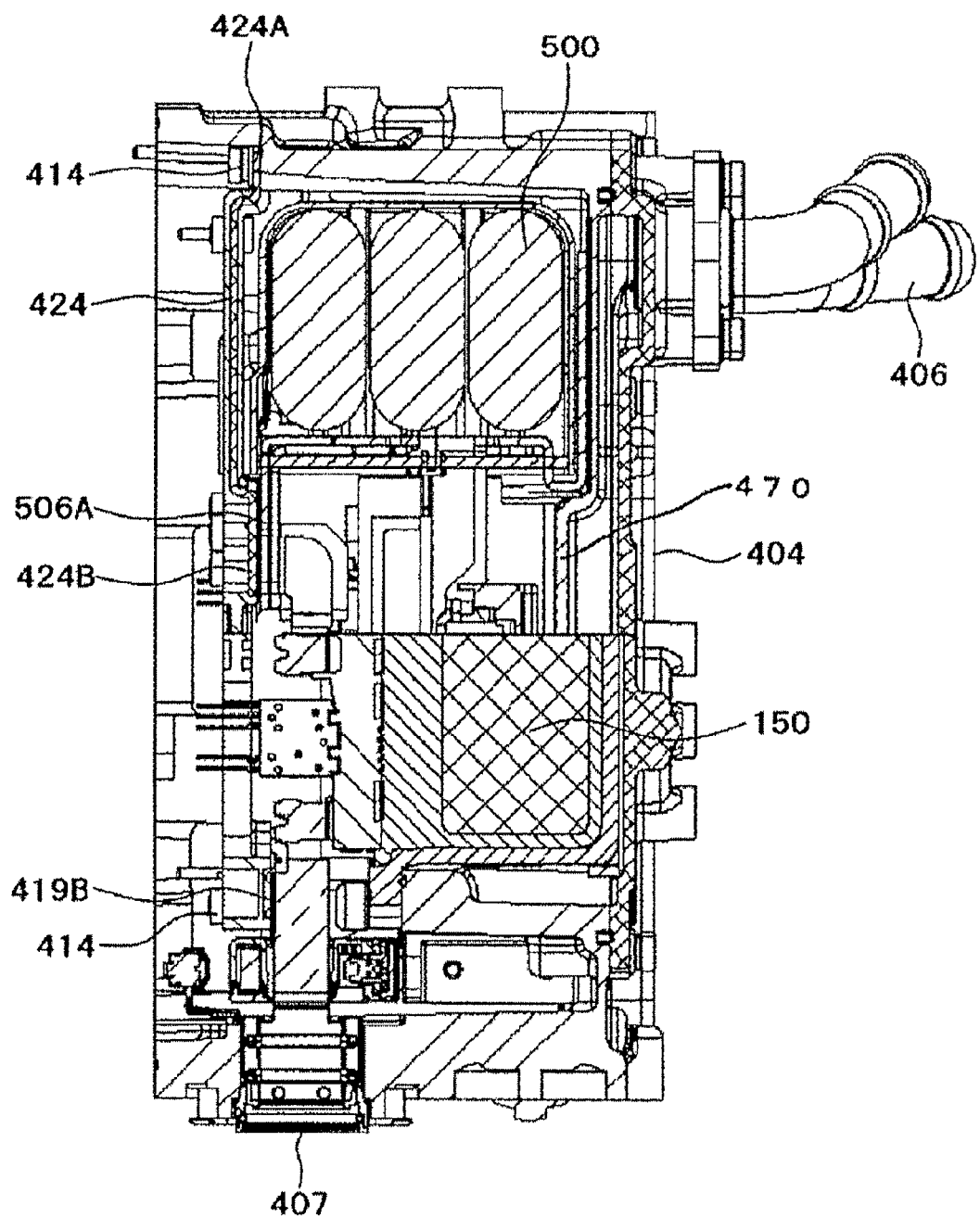
FIG. 12 is a cross-sectional view illustrating a B-B cross section of the power converter illustrated in FIG. 10.

FIG. 10 is a front view of a state in which the upper cover 419 and the driver circuit substrate 418 of the power converter are demounted, FIG. 11 is a front view of a state in which the cooling board 413 is demounted, and FIG. 12 is a cross-sectional view of the power converter illustrated in FIG. 10 taken along the line B-B.

In FIG. 10, the cooling board 413 is firmly fixed to the housing 400 of the power converter via the mounting portions 424A of the cooling panel 424 and the mounting portions 425A of the cooling panel 425 with the fixing screws 414.

As illustrated in FIG. 11, the heat receiving portion 424B of the cooling panel 424 is positioned to come into contact with the positive side capacitor terminals 506 and the conductive surfaces 506A of the capacitor module 500 via the heat discharging sheet 415.

In the same manner, the three AC connection bus bars 416 connecting the power modules 150 and the AC terminals 407 are positioned so that a heat receiving portion 425B of the cooling panel 425 comes into contact therewith via the heat discharging sheet 417. The AC connection bus bars 416 are formed to be thick in order to increase the heat transmitting surface area, and are in thermal contact with the heat receiving portion 425B via the heat discharging sheet 417.

Therefore, as illustrated in FIG. 12, heat accumulated in the capacitor module 500 and heat generated by the capacitor module 500 itself are transmitted to the heat receiving portion 424B of the cooling panel 424 from the positive side capacitor terminals 506 and the conductive surfaces 506A thereof through the heat discharging sheet 415, and further flows through the heat transmitting portion 424C to the mounting portions 424A and transmitted to the housing 400.

Since the housing 400 is cooled by air in the periphery or the cooling medium flowing in and out from the pipe 406, the temperature is lower than the capacitor module 500. Heat of the capacitor module 500 flows efficiently to the housing 400 owing to the difference in temperature gradient.

A flow channel forming member 470 forms a flow channel which allows the cooling medium to flow. The capacitor module 500 is arranged between the cooling board 413 and the flow channel forming member 470. Accordingly, cooling performance of the capacitor module 500 is further improved by causing heat of the power modules 150 transmitted via the positive side capacitor terminals 506 and the negative side capacitor terminals 504 to transmit the cooling board 413, and providing the flow channel forming member 470 on the side opposite to the cooling board 413 via the capacitor module 500.

The pipe 406 is arranged so as to oppose the capacitor module 500 with the flow channel of the flow channel forming member 470 interposed therebetween. The cooling medium flowing in from the pipe 406 on the inlet port side is cooled sufficiently. Therefore, the capacitor module 500 is cooled by this cooling medium, and hence the cooling performance is further improved.

Here, the positive side capacitor terminals 506 of the capacitor module 500 and the conductive surfaces 506A thereof are in thermally contact with the cooling panel 424. However, a configuration in which the polarity of the capacitor terminals are inverted to release heat of the capacitor module 500 from the cooling panel 424 is also applicable.

In the same manner, heat from the outside flowing from the AC terminals 407 into the AC connection bus bars 416 (for example, heat from the electric motor) flows through the heat discharging sheet 417, is transmitted to the heat receiving portion 425B of the cooling panel 425, flows further through the heat transmitting portions 425C to the mounting portions 425A, and is transmitted to the housing 400. The temperature of the housing 400 is lower than that of the AC connection bus bars 416 because the housing 400 is cooled by air in the periphery thereof and the cooling medium flowing in and out from the pipe 406, so that the heat of the AC connection bus bars 416 flows to the housing 400 efficiently by the difference in temperature gradient.

As described thus far, in the power converter, cooling of the power converter is extremely important for improving a power conversion performance. Specifically, the DC smoothing capacitor module stored in the housing of the power converter is heat-sensitive, and in order to secure the performance, efficient cooling of the capacitor module is required, and also a reduction of heat entering from the outside as much as possible is required.

In order to fulfill such requirements, in the present invention, heat of the capacitor module is released to the housing by the cooling panel provided on the cooling board, and heat entering from the outside is released to the housing by the cooling panel. Therefore, a thermal environment in the housing can be improved efficiently.

Furthermore, according to the embodiment, the cooling board is just fixed to the housing. Therefore, an increase in size of the apparatus and complication of the structure such as adding a channel newly for the cooling medium or significant alteration of a metal mold are not necessary.

Therefore, in the case where the power converter is employed for the automotive vehicle, an increase in size of the housing is avoided, and ease of mounting is improved and, in addition, manufacturing cost may be reduced. Therefore, a significant economical effect is achieved.

REFERENCE SIGNS LIST

140 . . . inverter circuit unit, 150 . . . power module, 172 . . . control circuit unit, 174 . . . driver circuit, 200 . . . power converter, 400 . . . housing, 400A . . . long side wall portion, 400B . . . short side wall portion, 402 . . . storage portion, 403 . . . storage portion, 404 . . . lower cover, 405 . . . fixing screw, 406 . . . heat discharging sheet, 407 . . . DC terminal, 408 . . . AC terminal, 409 . . . DC side connecting port, 410 . . . AC side connecting port, 413 . . . cooling board, 414 . . . fixing screw, 415 . . . heat discharging sheet, 415A . . . insulating sheet portion, 415B . . . heat discharging sheet portion, 416 . . . AC connection bus bar, 417 . . . heat discharging sheet, 417A . . . insulating sheet portion, 417B . . . heat discharging sheet portion, 418 . . . upper cover, 420 . . . fixing screw, 421 . . . control circuit portion substrate, 422 . . . side cover, 424 . . . cooling panel, 424A . . . mounting portion, 424B . . . heat receiving portion, 424C . . . heat transmitting portion, 425 . . . cooling panel, 425A . . . mounting portion, 425B . . . heat receiving portion, 425C . . . heat transmitting portion, 500 . . . capacitor module, 500A . . . side surface portion, 506 . . . positive side capacitor terminal, 504 . . . negative side capacitor terminal, 508 . . . negative side power source terminal, 509 . . . positive side power source terminal

The invention claimed is:

1. A power converter comprising:
a housing having a storage space formed in an interior thereof;
a capacitor module placed in the storage space;
a DC terminal provided in the housing connected to the capacitor module;
a power module electrically connected to the capacitor module;
an AC terminal connected to the power module and provided in the housing;
an AC connection bus bar configured to connect the AC terminal and the power module; and
a cooling board which includes a cooling panel formed of a metal and embedded in a synthetic resin, wherein the cooling panel thermally connects capacitor terminals of the capacitor module and the housing and/or the AC connection bus bar and the housing.

2. The power converter according to claim 1, wherein positive side and negative side capacitor terminals and positive side and negative side power source terminals are provided on a side surface of the capacitor module opposing the power module.

3. The power converter according to claim 1, wherein the capacitor module includes a capacitor element, a case configured to store the capacitor element, and a resin sealing material filled in the storage space in the case,
the case includes an exposed surface where the resin sealing material is exposed,
the case is arranged on the side of the power module so that the exposed surface and the power module oppose each other, and
the capacitor terminals project from the exposed surface so as to extend in parallel to a cooling surface of the cooling board with respect to the capacitor terminals and are connected to the power module.

4. The power converter according to claim 1, wherein the cooling panel is thermally in contact with the capacitor terminals via a heat discharging sheet having an insulating function and a heat discharging function, and is thermally connected to the housing by being fixed with a fixing screw, and/or is thermally in contact with the AC connection bus bar via the heat discharging sheet provided with the insulating function and the heat discharging function, and is thermally connected to the housing by being fixed with the fixing screw.

5. The power converter according to claim 4, wherein the heat discharging sheet is a composite sheet including an insulating sheet portion having an insulating function and a heat discharging sheet portion having a heat discharging function.

6. The power converter according to claim 4, wherein
the heat discharging sheet is a composite sheet including
 an insulating sheet portion having an insulating function and the heat discharging sheet portion having the heat discharging function, and the heat discharging sheet portion is thicker than the insulating sheet portion.

7. The power converter according to claim 1, comprising:
a flow channel forming member configured to form a flow channel which allows a cooling medium to flow, wherein
the capacitor module is arranged between the cooling board and the flow channel forming member.

8. The power converter according to claim 7, comprising:
an inlet port pipe connected to the flow channel, wherein
the inlet port pipe is arranged so as to oppose the capacitor module with the flow channel interposed therebetween.

9. A power converter comprising:
a box-shaped housing surrounded by a pair of long side wall portions and a pair of short side wall portions having a storage space formed therein;
a capacitor module placed in the storage space between one of the short side wall portions and a pair of the long side wall portions of the housing;
a power module arranged between the other short side wall portion on the side opposite to the capacitor module and the capacitor module, and electrically connected to the capacitor module;
a DC terminal connected to the capacitor module and provided on the other short side wall portion;
an AC terminal connected to the power module and provided on the other short side wall portion;
an AC connection bus bar configured to connect the AC terminal and the power module, and positioned between the other short side wall portion and the power module, and
a cooling board which includes a cooling panel formed of a metal and embedded in a synthetic resin, wherein the cooling panel thermally connects capacitor terminals of the capacitor module and the pair of the long side wall portions and/or the AC connection bus bar and the pair of the long side wall portions.

10. The power converter according to claim 9, wherein
positive side and negative side capacitor terminals and positive side and negative side power source terminals are provided on a side surface of the capacitor module opposing the power module.

11. The power converter according to claim 9, wherein
the cooling panel is thermally in contact with the capacitor terminals via a heat discharging sheet having an insulating function and a heat discharging function, and is thermally connected to the pair of the long side wall portion by being fixed with a fixing screw, and/or is thermally in contact with the AC connection bus bar via the heat discharging sheet having the insulating function and the heat discharging function, and is thermally connected to the pair of the long side wall portions by being fixed with the fixing screw.

12. The power converter according to claim 11, wherein
the heat discharging sheet is a composite sheet including an insulating sheet portion having an insulating function and a heat discharging sheet portion having a heat discharging function.

13. The power converter according to claim 11, wherein
the heat discharging sheet is a composite sheet including an insulating sheet portion having an insulating function and a heat discharging sheet portion having a heat discharging function, and the heat discharging sheet portion is thicker than the insulating sheet portion.

14. The power converter according to claim 9, wherein
the capacitor module includes: a capacitor element; a case configured to store the capacitor element; and a resin sealing material to be filled in a storage space of the case, the case includes an exposed surface where the resin sealing material is exposed, the case is arranged on the side of the power module so that the exposed surface and the power module oppose each other, and the capacitor terminals project from the exposed surface so as to extend in parallel to a cooling surface of the cooling board with respect to the capacitor terminals and are connected to the power module.

15. The power converter according to claim 9, comprising:
a flow channel forming member configured to form a flow channel which allows a cooling medium to flow, wherein
the capacitor module is arranged between the cooling board and the flow channel forming member.

16. The power converter according to claim 15, comprising:
an inlet port pipe connected to the flow channel,
wherein the inlet port pipe is arranged so as to oppose the capacitor module with the flow channel interposed therebetween.

17. A power converter comprising:
a housing having a storage space formed in an interior thereof;
a capacitor module placed in the storage space;
a DC terminal provided in the housing connected to the capacitor module;
a power module electrically connected to the capacitor module;
an AC terminal connected to the power module and provided in the housing;
an AC connection bus bar configured to connect the AC terminal and the power module; and
a cooling board which is in contact with capacitor terminals of the capacitor module via a heat discharging member having an insulating function and a heat discharging function.

18. The power converter according to claim 17, wherein
the capacitor module includes
a capacitor element; and
a case having a storage space for storing the capacitor element and an opening communicating with the storage space, the capacitor terminals are connected to the power module;
the case is arranged so that the opening and the power module oppose each other, and
the capacitor terminals project from the opening and are connected to the cooling board.

* * * * *